United States Patent
Dobyns et al.

(10) Patent No.: US 8,046,183 B2
(45) Date of Patent: Oct. 25, 2011

(54) PRE-TRIGGER AND POST-TRIGGER ACQUISITION FOR NO DEAD TIME ACQUISITION SYSTEM

(75) Inventors: Kenneth P. Dobyns, Beaverton, OR (US); Kristie L. Veith, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 291 days.

(21) Appl. No.: 12/042,271

(22) Filed: Mar. 4, 2008

(65) Prior Publication Data

US 2009/0228226 A1 Sep. 10, 2009

(51) Int. Cl.
G01R 13/02 (2006.01)
G01R 13/00 (2006.01)
G06F 19/00 (2006.01)
G06F 17/40 (2006.01)

(52) U.S. Cl. ...... 702/67; 73/866.3; 324/76.38; 324/113; 345/440.1; 702/187; 702/189

(58) Field of Classification Search .............. 702/66–67, 702/69–71, 79–80, 176–177, 1, 57, 127, 702/187, 189; 324/76.15, 76.24, 76.38, 76.42, 324/121 R, 76.11, 76.12, 76.13, 76.19, 76.39, 324/76.41, 113; 345/440–440.1, 418; 73/432.1, 73/865.8, 866.3; 340/500, 540, 657
See application file for complete search history.

(56) References Cited

U.S. PATENT DOCUMENTS

| | | | | |
|---|---|---|---|---|
| 3,790,767 A * | 2/1974 | Alexander | | 702/108 |
| 4,072,851 A * | 2/1978 | Rose | | 702/68 |
| 4,104,725 A * | 8/1978 | Rose et al. | | 702/68 |
| 4,244,024 A * | 1/1981 | Marzalek et al. | | 702/68 |
| 4,507,740 A * | 3/1985 | Star et al. | | 702/57 |
| 4,758,963 A * | 7/1988 | Gordon et al. | | 702/80 |
| 4,975,636 A * | 12/1990 | Desautels | | 324/121 R |
| 5,122,800 A * | 6/1992 | Philipp | | 341/156 |
| 5,180,971 A * | 1/1993 | Montijo | | 324/121 R |
| 5,530,454 A * | 6/1996 | Etheridge et al. | | 345/440.1 |
| 5,841,286 A * | 11/1998 | Stoops | | 324/511 |
| 5,986,637 A * | 11/1999 | Etheridge et al. | | 345/596 |
| 5,995,117 A * | 11/1999 | Dobyns et al. | | 345/441 |
| 5,999,163 A * | 12/1999 | Ivers et al. | | 345/208 |
| 6,380,939 B2 * | 4/2002 | Maguire et al. | | 345/440.1 |
| 6,473,701 B1 * | 10/2002 | Tallman et al. | | 702/67 |

(Continued)

FOREIGN PATENT DOCUMENTS

EP 2098874 A2 * 9/2009

(Continued)

*Primary Examiner* — Edward Cosimano

(74) *Attorney, Agent, or Firm* — Francis I. Gray; Thomas F. Lenihan

(57) ABSTRACT

Pre-trigger and post-trigger acquisition for a no dead time acquisition system, where the data being displayed does not include a related trigger event, has a variable record length buffer having a maximum record length equal to a maximum desired pre-trigger interval, and has a trigger FIFO and timer for delaying the related trigger event. The record length of the buffer is determined by the desired pre-trigger interval, and fast rasterizers access the oldest data that encompasses the desired pre-trigger data. A first trigger event in the trigger signal may be delayed by a desired post-trigger interval before the fast rasterizers begin drawing the waveform data that encompasses the desired post-trigger data.

6 Claims, 2 Drawing Sheets

U.S. PATENT DOCUMENTS

| | | | |
|---|---|---|---|
| 6,847,905 B2 * | 1/2005 | Etheridge et al. | 702/67 |
| 7,529,641 B2 * | 5/2009 | Sullivan | 702/176 |
| 7,652,465 B2 * | 1/2010 | Sullivan et al. | 324/121 R |
| 7,855,547 B2 * | 12/2010 | Dobyns et al. | 324/121 R |
| 2001/0012009 A1 * | 8/2001 | Maguire et al. | 345/418 |
| 2004/0008160 A1 * | 1/2004 | Etheridge et al. | 345/30 |
| 2007/0222429 A1 * | 9/2007 | Sullivan et al. | 324/76.15 |
| 2007/0250278 A1 * | 10/2007 | Sullivan | 702/67 |
| 2009/0249363 A1 * | 10/2009 | Dobyns et al. | 719/318 |
| 2009/0261814 A1 * | 10/2009 | Dobyns et al. | 324/121 R |

FOREIGN PATENT DOCUMENTS

| | | | |
|---|---|---|---|
| EP | 2110674 A2 * | 10/2009 | |
| JP | 2009-210576 A * | 9/2009 | |

* cited by examiner

PRE-TRIGGER AND POST-TRIGGER ACQUISITION FOR NO DEAD TIME ACQUISITION SYSTEM

FIELD OF THE INVENTION

The present invention relates to an acquisition system for a digital oscilloscope, and in particular to a no dead time acquisition system.

BACKGROUND OF THE INVENTION

The "dead time" of a measurement instrument, such as an oscilloscope, is a time period during which data acquisition circuitry does not respond to a valid trigger event because the oscilloscope is busy performing other tasks and so is not able to process trigger events that may occur. Consequently, a waveform representing an electrical signal being monitored is not displayed for the missed valid trigger event. In an analog oscilloscope, for example, dead time occurs during the beam retrace time on a cathode ray tube. In a digital oscilloscope, dead time often occurs when the instrument is busy reading data from an acquisition memory associated with a previous acquisition, or busy drawing the acquired processed data to produce an image of the waveform for display.

Circuits under test often operate at rates much faster than a standard digital oscilloscope can display the corresponding waveforms. In fact, the typical digital oscilloscope "ignores" most trigger events because it is busy processing and drawing waveforms relating to data acquired in response to a prior trigger event. It is an unfortunate fact that such electronic circuits under test occasionally work in an unexpected manner. Occurrences of incorrect operation of the circuits under test may be rare, perhaps occurring once in thousands of correct cycles of operation. Thus, the oscilloscope may not acquire data representing waveforms that exhibit the incorrect operation of the circuit under test (i.e., an anomaly), because the oscilloscope may be busy at the instant that the anomaly occurs. An oscilloscope user may have to wait a long time in order to view the incorrect operation. Since only a small fraction of the waveforms are drawn on the oscilloscope display, failure to observe the incorrect operation cannot give the user confidence that the circuit under test is operating properly.

The basic digital oscilloscope has an architecture in which data is received and stored in an acquisition memory, and then acquisition is halted by a trigger event after a defined post-trigger interval. The acquired data then is read from the acquisition memory for processing and waveform drawing on a display before the acquisition system is again enabled to respond to new trigger events.

U.S. Pat. No. 7,652,465, issued to Steven Sullivan et al on Jan. 26, 2010, entitled "No Dead Time Data Acquisition", herein incorporated by reference, is one attempt to enable the acquisition for display of data representing all trigger events. A measurement instrument receives a digitized signal representing an electrical signal being monitored and uses a fast digital trigger circuit to generate a trigger signal, wherein the trigger signal includes all trigger events within the digitized signal. The digitized signal is compressed as desired and delayed by a first-in, first-out (FIFO) buffer for a period of time (pre-trigger delay) to assure a predetermined amount of data prior to a first trigger event in the trigger signal. The delayed digitized signal from the FIFO is delivered to a fast rasterizer or drawing engine, upon the occurrence os the first trigger event, to generate a waveform image. The waveform image is then provided to a display buffer for combination with prior waveform images and/or other graphic inputs from other drawing engines. The contents of the display buffer are provided on a display screen at a display update rate to show a composite of all waveform images representing the electrical signal.

Two or more drawing engines may be used for each input channel of the measurement instrument to produce two or more waveform images, each waveform image having one of the trigger events at a specified trigger position within a display window. The waveform images are combined to form a composite waveform image containing all the trigger events for combination with the previous waveform images in the display buffer or with graphics from other drawing engines. For certain trigger positions within the display window, an indicator is provided to show that a trigger event may have been missed. Also, when there are no trigger events, a graphic of the signal content may still be provided for the display.

The described "no dead time acquisition system" has limited usefulness in some ways. For example, when zoom is turned on, a zoom window may be moved to a pre-trigger location that does not include a trigger event within the zoom window, i.e., the desired data for display occurs appreciably before the trigger event, and thus is not in the FIFO when the trigger event occurs to initiate waveform drawing by the fast rasterizers. In such a case, there may be no data for inclusion within the zoom window for display because the data in the FIFO has already been overwritten. This is because the no dead time acquisition system acquires and processes for display only the digitized signal from the FIFO which occurred around the trigger event.

Similarly, the zoom window may be moved to a post-trigger location that also does not include a trigger event within the zoom window. That is, the drawn waveform including the trigger event is completed before the desired post-trigger location occurs in the input signal, or the horizontal position for the waveform image may be delayed such that the acquisition is delayed from the trigger point. In these latter two cases, the no dead time acquisition system may not have data to produce a waveform for display since the waveform display is generated from the FIFO in response to the trigger event and is limited to the display screen size.

An example of the pre-trigger problem is shown in display 100 FIG. 1. In the upper portion of prior art FIG. 1, a waveform 110 is shown that represents a long record length acquired data signal. In waveform 110, a trigger point is indicated by a dot and a zoom window location is enclosed by brackets. The contents of the zoom window are shown in waveform 120 in a lower portion of the display 100. With an ordinary long record length acquisition system as shown, this behavior is not a problem as the instrument looks into the waveform memory post-acquisition to extract the data points necessary to draw the contents shown in the zoom window. However, since one of the basic tradeoffs to make the no dead time acquisition system work with current technology is that the data acquired during each acquisition cycle is highly compressed, this limits the amount of data that needs to be processed in real time by the specialized drawing hardware of the no dead time acquisition system. If this extremely short record defined by the FIFO were used directly to draw the zoom window using only the data within the FIFO, the results would be very unsatisfying. For example for a record length of 450 pairs of points, if the display is zoomed by a factor of 10,000, which is not unusual for a modern long record length instrument, there would be far less than one pair of data points available within the zoom window. Clearly, no meaningful information is drawn in this case, so the no dead time acquisition system cannot produce the display.

The pre-trigger zoom record cannot be acquired at full resolution in the no dead time acquisition system because there is no way to know when to stop a particular acquisition cycle, i.e., the acquisition system cannot know to stop acquiring before the trigger event becomes visible. In other words the pre-trigger period for the no dead time acquisition system is defined by the length of the FIFO.

When the zoom window is moved to a post-trigger location, as shown in FIG. 2, the traditional long record length acquisition system simply counts off a longer delay period after the trigger before stopping. However, this simple method is not possible with the no dead time acquisition system. The arrows of FIG. 2 mark individual trigger events in the input signal. When the first trigger event occurs, the data associated with that trigger is not available until the time indicated by brackets near the right edge of the screen. The acquisition system delays processing this data until the proper time, but during this delay five more trigger events are detected. Then during the processing of the delayed data another two trigger events are detected. Each of these seven trigger events have corresponding data that need to be identified and processed if the acquisition is to maintain its "no dead time" status.

SUMMARY OF THE INVENTION

Accordingly, the present invention provides a no dead time acquisition system that allows for display of both pre-trigger and post-trigger data for an input electrical signal, which display does not necessarily also include a trigger event. The no dead time acquisition system is modified by replacing a short length data FIFO with a variable record length acquisition buffer, the maximum record length of which may equal the length of a conventional long record length acquisition memory. A desired pre-trigger interval determines the record length of the acquisition buffer so that, when a first trigger event occurs, fast rasterizers access the oldest data in the acquisition buffer that encompasses the desired pre-trigger data without necessarily including the first trigger event within the displayed waveform. Further modification includes delaying the first trigger event by a desired post-trigger interval before triggering the fast rasterizers to begin drawing the waveform from the data in the acquisition buffer, the resulting display of post-trigger data not necessarily including the first trigger event.

The objects, advantages and other novel features of the present invention are apparent from the following detailed description when read in conjunction with the appended claims and attached drawing.

DETAILED DESCRIPTION OF THE INVENTION

Figure 1:
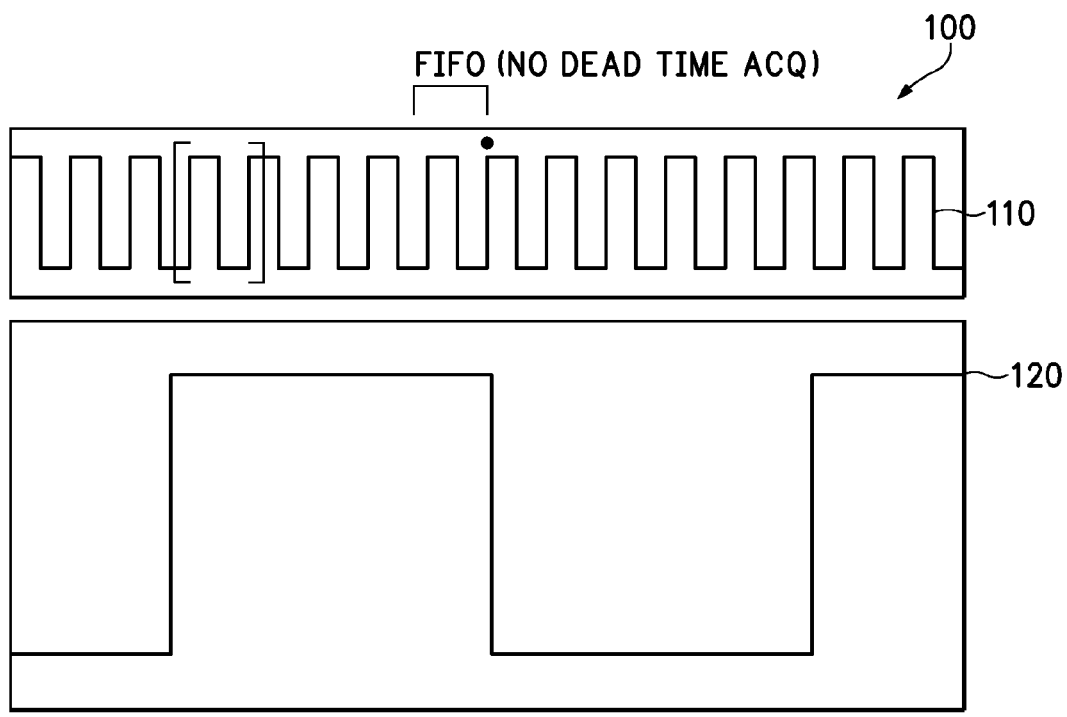
FIG. 1 is a plan view of a screen view showing a long data length record of acquired data together with a pre-trigger zoom window that does not include the trigger event according to the prior art.
Figure 2:
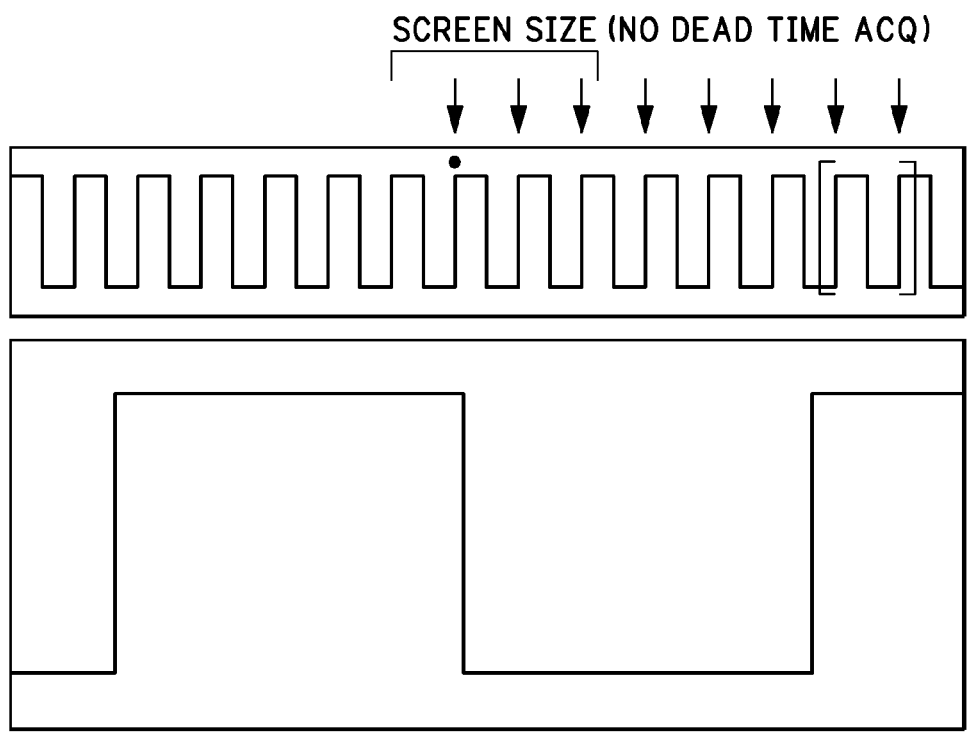
FIG. 2 is a plan view of a screen view showing a long data length record of acquired data together with a post-trigger zoom window that does not include the trigger event of interest according to the prior art.
Figure 3:
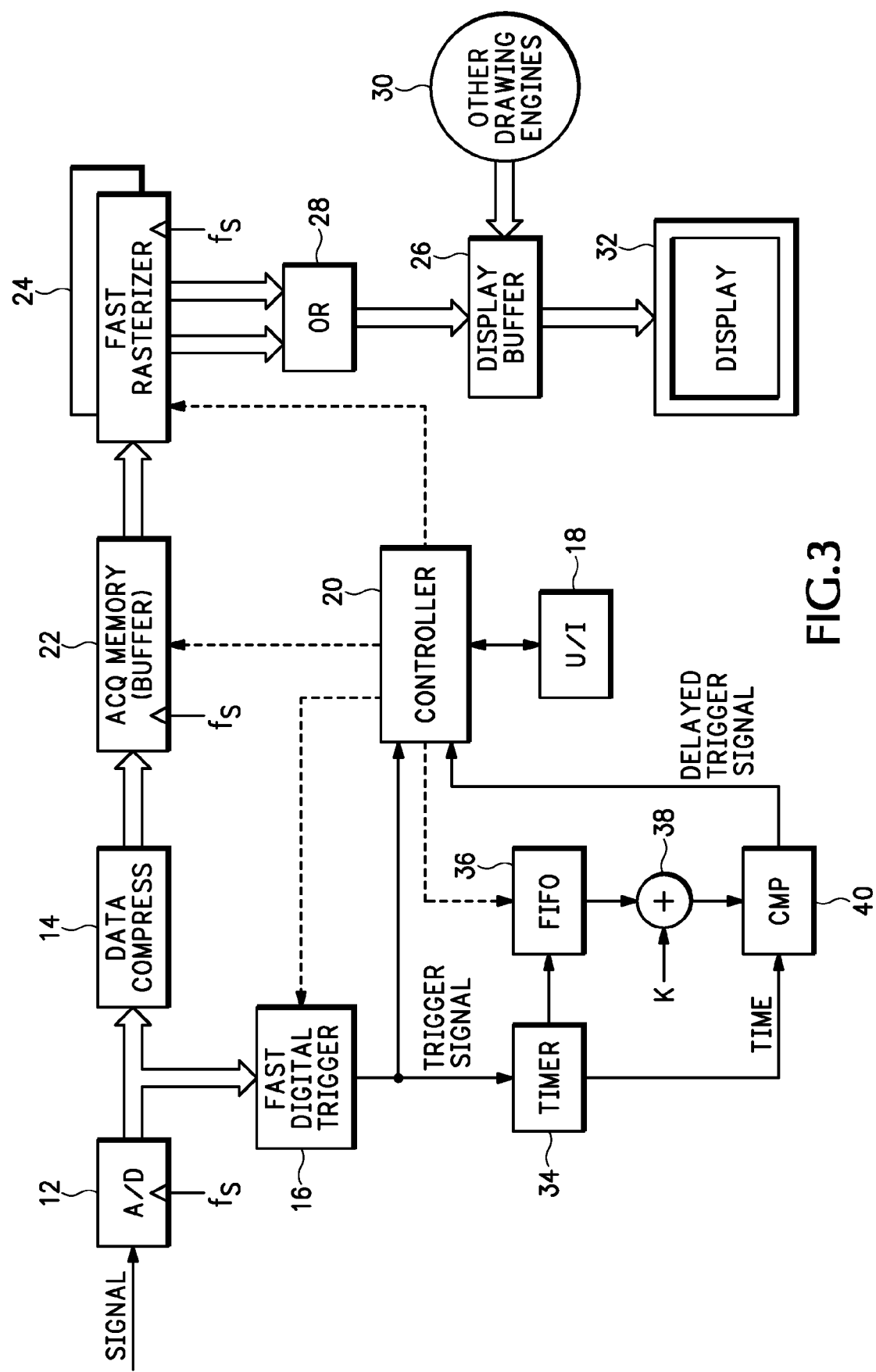
FIG. 3 is a block diagram view of a no dead time acquisition system that allows both pre-trigger and post-trigger acquisition of an input signal for display according to the present invention.

Referring now to FIG. 3, an electrical signal being monitored is sampled by an analog to digital converter (ND) 12 at a sampling rate, $f_s$. The digitized samples from the ND 12 are input to a data compression circuit 14 and to a fast digital trigger circuit 16. The fast digital trigger circuit 16 outputs a trigger signal in response to trigger events detected from the digitized samples, the trigger events being defined by a user via a user interface (U/I) 18 that communicates with a controller 20. Compressed digitized samples from the data compression circuit 14 are input to a buffer/acquisition memory 22 which is larger than the FIFO described in the above-mentioned U.S. Pat. No. 7,652,465. The buffer 22 has a sufficient capacity to contain enough digitized samples to encompass a reasonably large pre-trigger and post-trigger number of digitized samples, and may be as large as conventional long record length acquisition memories. Output from the buffer 22 is input to one or more fast rasterizers 24 which draw waveforms from the buffer output for storage in a display buffer 26 in real time, rather than post-processing data from a stored signal record. That is, essentially, fast rasterizers 24 operate on data as soon as the desired data is acquired from the compression circuit 14, subject to the delay required to process through the buffer memory 22. The waveforms from the fast rasterizers 24 may be combined, such as by an OR gate 28, before being written into the display buffer 26. Additional information from other drawing engines 30, such as graphics and alpha-numeric data, may also be combined in the display buffer 26 with the waveforms from the fast rasterizers 24 to form a composite image. The composite image from the display buffer 26 is provided to a display device 32 as a screen display at a refresh display rate.

The trigger signal from the fast digital trigger circuit 16 is input to a timer 34 which provides a trigger event time for each trigger event in the trigger signal. The trigger event times are stored in a trigger first-in, first-out (FIFO) memory 36. Trigger times from the trigger FIFO 36 are input to a summing circuit 38 to which also is input a constant time increment, K, representing a desired post-trigger interval. The trigger time plus post-trigger time for each trigger event time of the FIFO is input to a comparator 40, where it is compared with a time value from the timer 34 to produce a delayed trigger signal. The trigger and delayed trigger signals are input to the controller 20 which in turn controls access to the buffer 22 and the trigger FIFO 36 as well as the fast rasterizers 24.

In a normal no dead time acquisition system where the waveform display includes the initiating trigger event, the buffer memory 22 is controlled by the controller 20 as a short length FIFO and operates as described in the aforementioned U.S. Pat. No. 7,652,465. In other words, the controller 20 forwards the latest data input to the buffer memory 22 to the fast rasterizers 24 so that the resulting drawn waveform includes the trigger event within the screen display. For a drawn waveform representing pre-trigger data that does not include the trigger event within the screen display, the controller 20, in response to the trigger signal, forwards the data from the buffer memory 22 to the fast rasterizers 24, starting at a point within the buffer memory that is equivalent to the desired pre-trigger interval. For a drawn waveform representing post-trigger data that does not include the trigger event within the screen display, the controller 20, in response to the delayed trigger signal, forwards the latest data input to the buffer memory 22 to the fast rasterizers 24. Both the pre-trigger and post-trigger intervals are specified by the user via the U/I 18. In essence, the controller 20 sets the record length of the buffer 22 according to the desired pre-trigger delay, and the fast rasterizers 24 access the same amount of data for each of the three situations—normal (trigger event on screen display), pre-trigger and post-trigger—to provide the drawn waveform representing the input signal. Only for the pre-trigger situation is the record length of the buffer 22 necessarily set to be greater than the normal no dead time acquisition system FIFO, which length is a function of the desired pre-trigger interval up to the maximum record length of the buffer. Also, the FIFO for the no dead time acquisition system may be partitioned from a portion of the conventional long record length acquisition memory.

Although a trigger FIFO 36 and timer 34 are shown in FIG. 3 as one embodiment of post-trigger acquisition in the no dead time acquisition system, other embodiments are possible so long as the drawing of the waveform for the input signal by the fast rasterizers 24 is delayed by the desired post-trigger interval.

Thus, the present invention provides for pre-trigger and post-trigger acquisition of data in a no dead time acquisition system by expanding the length of the FIFO into a variable record length acquisition buffer and by enabling readout from any point within the buffer, while the buffer is still receiving data for drawing by fast rasterizers for pre-trigger acquisition, and further by adding a trigger FIFO and timer for delaying the trigger signal for post-trigger acquisition. Since the pre-trigger and post-trigger data are acquired at the desired resolution, the zoom problem associated with only displaying data around a specified trigger event in the trigger signal is avoided.

What is claimed is:

1. A no dead time acquisition system for use in a digital oscilloscope, comprising:
   means for recognizing all trigger events within an electrical signal being monitored to produce a trigger signal;
   means for delaying a digitized signal representing the electrical signal, the delaying means including a buffer having a variable record length for delaying the digitized signal by an amount equal to a desired pre-trigger interval, the desired pre-trigger interval defining the variable record length, said variable length buffer being controllable to read out said delayed digitized signal from any point within said buffer;
   means for drawing a waveform for the digitized signal from the delaying means in real time in response to the trigger signal such that the waveform represents the electrical signal at the desired pre-trigger interval prior to a first trigger event within the trigger signal; and
   means for delaying the trigger signal by a desired post-trigger interval to produce a delayed trigger signal so that the drawing means, in response to the delayed trigger signal, produces the waveform that represents the electrical signal at the desired post-trigger interval after the first trigger event within the trigger signal.

2. A no dead time acquisition system comprising:
   means for recognizing all trigger events within an electrical signal being monitored to produce a trigger signal;
   means for delaying the digitized signal representing the electrical signal, said delaying means being controllable to read out said delayed digitized signal from any point within said delaying means;
   means for drawing a waveform for the digitized signal from the delaying means in real time in response to the trigger signal: and
   means for delaying the trigger signal by a desired post-trigger interval to produce a delayed trigger signal so that the drawing means in response to the delayed trigger signal produces the waveform that represents the electrical signal at the desired post-trigger interval after a first trigger event within the trigger signal.

3. The no dead time acquisition system as recited in claim 2, wherein
   the digitized signal delaying means comprises a buffer having a variable record length for delaying the digitized signal by an amount equal to a desired pre-trigger interval, the desired pre-trigger interval defining the variable record length, so that the waveform represents the electrical signal at the desired pre-trigger interval prior to the first trigger event within the trigger signal.

4. A no dead time acquisition system, comprising:
   a trigger recognizer for identifying all trigger events within an input signal, the trigger recognizer having as an input digitized data representing the input signal and having as an output a trigger signal representing all the trigger events;
   a buffer for temporarily storing a portion of the digitized data, the buffer having as an input the digitized data and having an output, and further having a variable record length determined by a desired pre-trigger interval, said buffer being controllable to read out said delayed digitized signal from any point within said buffer; and
   a fast rasterizer for drawing a waveform image, the fast rasterizer having as an input the portion of the digitized data from the output of the variable record length buffer, when enabled by one of the trigger events contained in the trigger signal, and having as an output the waveform image representing the portion of the digitized data contained in the buffer.

5. The system as recited in claim 4, further comprising:
   a trigger delay circuit for delaying the trigger signal, the trigger delay circuit having as an input the trigger signal and having as an output a delayed trigger signal, where the fast rasterizer is enabled to draw the waveform image by one of the trigger events contained in the delayed trigger signal, and further having a delay interval equal to a desired post-trigger delay.

6. A method of acquiring an input signal being monitored without dead time comprising the steps of:
   recognizing all trigger events within the input signal to produce a trigger signal;
   delaying a digitized signal representing the input signal, the delaying step having a buffer with a variable record length determined by a desired pre-trigger interval, said buffer being controllable to read out said delayed digitized signal from any point within said buffer;
   drawing a waveform for the digitized signal from the delaying step in real time in response to the trigger signal, such that the waveform represents the input signal at the desired pre-trigger interval prior to a first trigger event within the trigger signal; and
   delaying the trigger signal by a desired post-trigger interval to produce a delayed trigger signal, such that the drawing step in response to the delayed trigger signal produces the waveform that represents the input signal at the desired post-trigger interval after the first trigger event within the trigger signal.

* * * * *